United States Patent
Ito et al.

(10) Patent No.: US 12,046,574 B2
(45) Date of Patent: Jul. 23, 2024

(54) ULTRASONIC HORN AND MANUFACTURING APPARATUS OF SEMICONDUCTOR DEVICE

(71) Applicant: SHINKAWA LTD., Tokyo (JP)

(72) Inventors: Yuhei Ito, Tokyo (JP); Nobuyuki Aoyagi, Tokyo (JP); Mitsuaki Sakakura, Tokyo (JP); Takuya Asami, Tokyo (JP); Hikaru Miura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 199 days.

(21) Appl. No.: 17/767,914

(22) PCT Filed: Jun. 14, 2021

(86) PCT No.: PCT/JP2021/022560
§ 371 (c)(1),
(2) Date: Apr. 10, 2022

(87) PCT Pub. No.: WO2022/264225
PCT Pub. Date: Dec. 22, 2022

(65) Prior Publication Data
US 2023/0343742 A1    Oct. 26, 2023

(51) Int. Cl.
*B23K 20/00*   (2006.01)
*B23K 20/10*   (2006.01)
(Continued)

(52) U.S. Cl.
CPC ........... *H01L 24/78* (2013.01); *B23K 20/002* (2013.01); *B23K 20/10* (2013.01); *B23K 20/005* (2013.01);
(Continued)

(58) Field of Classification Search
CPC ........... H01L 24/78; H01L 2224/78301; H01L 2224/78353; H01L 24/45; H01L 24/48;
(Continued)

(56) References Cited

U.S. PATENT DOCUMENTS

| | | | |
|---|---|---|---|
| 2008/0035265 A1* | 2/2008 | Zaretsky | G03G 15/161 156/218 |
| 2021/0114309 A1* | 4/2021 | Beach | B29C 66/8145 |
| 2021/0268679 A1* | 9/2021 | Kang | B23D 79/00 |

FOREIGN PATENT DOCUMENTS

| | | | | |
|---|---|---|---|---|
| CN | 112277323 A | * | 1/2021 | B29C 35/16 |
| JP | H06163648 A | * | 6/1994 | |

(Continued)

OTHER PUBLICATIONS

"International Search Report (Form PCT/ISA/210) of PCT/JP2021/022560," mailed on Aug. 31, 2021, pp.1-3.

*Primary Examiner* — Kiley S Stoner
(74) *Attorney, Agent, or Firm* — JCIPRNET

(57) ABSTRACT

An ultrasonic horn (50) includes: a vibration source part (53) to which an ultrasonic vibrator (58) is mounted; a tip end part (56) to which a capillary (18) is mounted; and an intermediate part (54) which is interposed between the tip end part (56) and the vibration source part (53) and propagates vibration generated by the ultrasonic vibrator (58) to the tip end part (56). The intermediate part (54) is formed with a single spiral hole (68) which is a hole penetrating in a radial direction of the ultrasonic horn (50) and advances in an axial direction as the spiral hole advances in a circumferential direction.

5 Claims, 5 Drawing Sheets

(51) Int. Cl.
 *H01L 23/00* (2006.01)
 *B23K 101/40* (2006.01)
(52) U.S. Cl.
 CPC *B23K 2101/40* (2018.08); *H01L 2224/78301* (2013.01); *H01L 2224/78353* (2013.01)
(58) Field of Classification Search
 CPC .................. H01L 24/85; H01L 24/74; H01L 2224/78702; B23K 20/002; B23K 20/10; B23K 2101/40; B23K 20/004; B23K 20/106; B23K 20/005; B23K 20/007; B06B 1/02; B06B 3/04; B29C 65/08–088
 USPC .................. 228/1.1, 110.1, 4.5, 180.5, 904; 156/73.1–73.6, 580.1–580.2
 See application file for complete search history.

(56) References Cited

FOREIGN PATENT DOCUMENTS

| | | | | | |
|---|---|---|---|---|---|
| JP | H08294673 | | 11/1996 | | |
| JP | 2000031196 | A * | 1/2000 | ............. | H01L 24/78 |
| JP | 2002209906 | | 7/2002 | | |
| JP | 2002209906 | A * | 7/2002 | | |
| JP | 2004275592 | | 10/2004 | | |
| JP | 2004275592 | A * | 10/2004 | | |
| JP | 2006340837 | | 12/2006 | | |
| KR | 100531610 | B1 * | 11/2005 | | |

\* cited by examiner

ULTRASONIC HORN AND MANUFACTURING APPARATUS OF SEMICONDUCTOR DEVICE

CROSS-REFERENCE TO RELATED APPLICATION

This application is a 371 application of the International PCT application serial no. PCT/JP2021/022560, filed on Jun. 14, 2021. The entirety of the above-mentioned patent application is hereby incorporated by reference herein and made a part of this specification.

TECHNICAL FIELD

The present specification discloses an ultrasonic horn used in an ultrasonic processing machine for vibration processing (joining, cutting, polishing, etc.) of an object, and a semiconductor device manufacturing apparatus having the ultrasonic horn.

RELATED ART

Conventionally, ultrasonic horns that generate longitudinal vibration and torsional vibration have been proposed in order to perform vibration processing of an object. Many of such ultrasonic horns have a plurality of inclined slits formed on the peripheral surface thereof in order to convert longitudinal vibration into torsional vibration. The inclined slit advances in the circumferential direction as it advances in the axial direction. Longitudinal vibration is converted into torsional vibration when passing through the inclined slit.

CITATION LIST

Patent Literature

[Patent Literature 1] Japanese Patent No. 8-294673

SUMMARY OF INVENTION

Technical Problem

However, such an inclined slit is formed only on the peripheral surface layer of the ultrasonic horn and does not reach the radial center of the ultrasonic horn. In this case, the efficiency of conversion from longitudinal vibration into torsional vibration is poor, and it is difficult to obtain sufficient torsional vibration.

Furthermore, in the conventional ultrasonic horn, a plurality of inclined slits independent of each other are inclined. In this case, mutual positions tend to vary among the plurality of inclined slits, and the vibration characteristics tend to fluctuate.

Therefore, the present specification discloses an ultrasonic horn and a manufacturing apparatus of a semiconductor device with which the desired vibration characteristics can be obtained more reliably.

Solution to Problem

An ultrasonic horn disclosed in the present specification includes: a vibration source part to which an ultrasonic vibrator is mounted; a tip end part to which a machining tool is mounted; and an intermediate part which is interposed between the tip end part and the vibration source part and propagates vibration generated by the ultrasonic vibrator to the tip end part. The intermediate part has a single spiral hole which is a hole penetrating in a radial direction of the ultrasonic horn and advances in an axial direction as the spiral hole advances in a circumferential direction.

In this case, the tip end part may have a mounting hole which penetrates in a first direction orthogonal to the axial direction and to which the machining tool is mounted, and a tip end side end portion of the spiral hole may penetrate in a direction substantially parallel to the first direction.

Further, the spiral hole may have a shape that advances by ¼ turn in the circumferential direction between a base end side end portion and the tip end side end portion.

Further, the intermediate part may have a tapered shape with a cross-sectional area that decreases from a base end side toward a tip end side.

A manufacturing apparatus of a semiconductor device disclosed in the present specification includes: the ultrasonic horn described above; and a cylindrical capillary which is mounted to the tip end part of the ultrasonic horn and through which a wire is inserted.

Effects of Invention

According to the technique disclosed in the present specification, the spiral hole penetrates the ultrasonic horn in the radial direction, so that the efficiency of conversion into torsional vibration is high. Therefore, it is sufficient to form one spiral hole in the ultrasonic horn. Then, by forming only one hole, an error in shape or the like can be suppressed as compared with the case of forming a plurality of slits, and it is easy to maintain the vibration characteristics as designed. As a result, according to the technique disclosed in the present specification, the desired vibration characteristics can be obtained more reliably.

DESCRIPTION OF EMBODIMENTS

Figure 1:
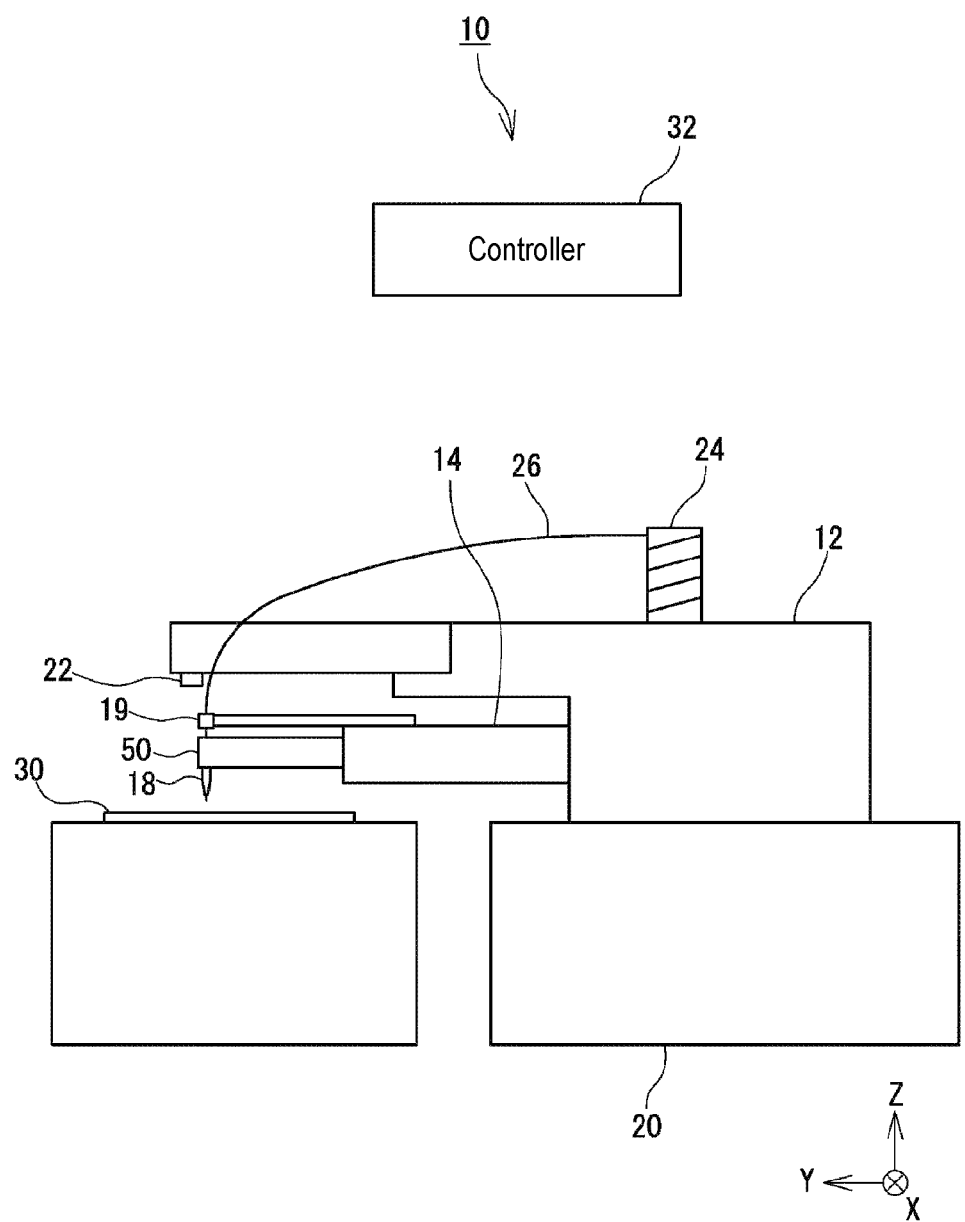
FIG. 1 is a view showing a configuration of the manufacturing apparatus of the semiconductor device equipped with the ultrasonic horn.

Hereinafter, the configurations of an ultrasonic horn 50 and a manufacturing apparatus of a semiconductor device equipped with the ultrasonic horn 50 will be described with reference to the drawings. FIG. 1 is a view showing the configuration of the manufacturing apparatus 10 equipped with the ultrasonic horn 50.

The manufacturing apparatus 10 is a wire bonding apparatus that manufactures a semiconductor device by connecting two electrodes provided on an object 30 with a wire 26.

The object 30 is, for example, a lead frame on which a semiconductor chip is mounted. Usually, electrodes are respectively provided on the semiconductor chip and the lead frame, and the semiconductor device is manufactured by electrically connecting these electrodes with the wire 26.

The manufacturing apparatus 10 has a bonding head 12 assembled to an XY stage 20. The XY stage 20 moves the bonding head 12 in the horizontal direction, that is, in an X direction and a Y direction. The ultrasonic horn 50 and a camera 22 are attached to the bonding head 12 so as to be movable in the vertical direction, that is, in a Z direction. The ultrasonic horn 50 is attached to the bonding head 12 via a horn holder 14. The ultrasonic horn 50 generates longitudinal vibration and torsional vibration and propagates them to a capillary. The capillary 18 is a cylindrical member which is attached to the distal end of the ultrasonic horn 50 and through which the wire 26 is inserted. The longitudinal vibration and torsional vibration are transmitted to the wire 26 via the capillary 18. Further, above the capillary 18, a clamper 19 that moves together with the capillary 18 and sandwiches the wire 26 is provided.

The camera 22 captures an image of the object 30 as required. A controller 32 identifies the position of the capillary 18 with respect to the object 30 based on the image captured by the camera 22, and positions the capillary 18. The bonding head 12 is further provided with a spool 24 around which the wire 26 is wound, and the wire 26 is unwound from the spool 24 as required. The controller 32 controls the drive of each part constituting the manufacturing apparatus 10. For example, the controller 32 applies a voltage of a predetermined frequency (that is, drive signal) to an ultrasonic vibrator 58 provided in the ultrasonic horn 50 to generate vibration of a predetermined frequency.

Figure 2:
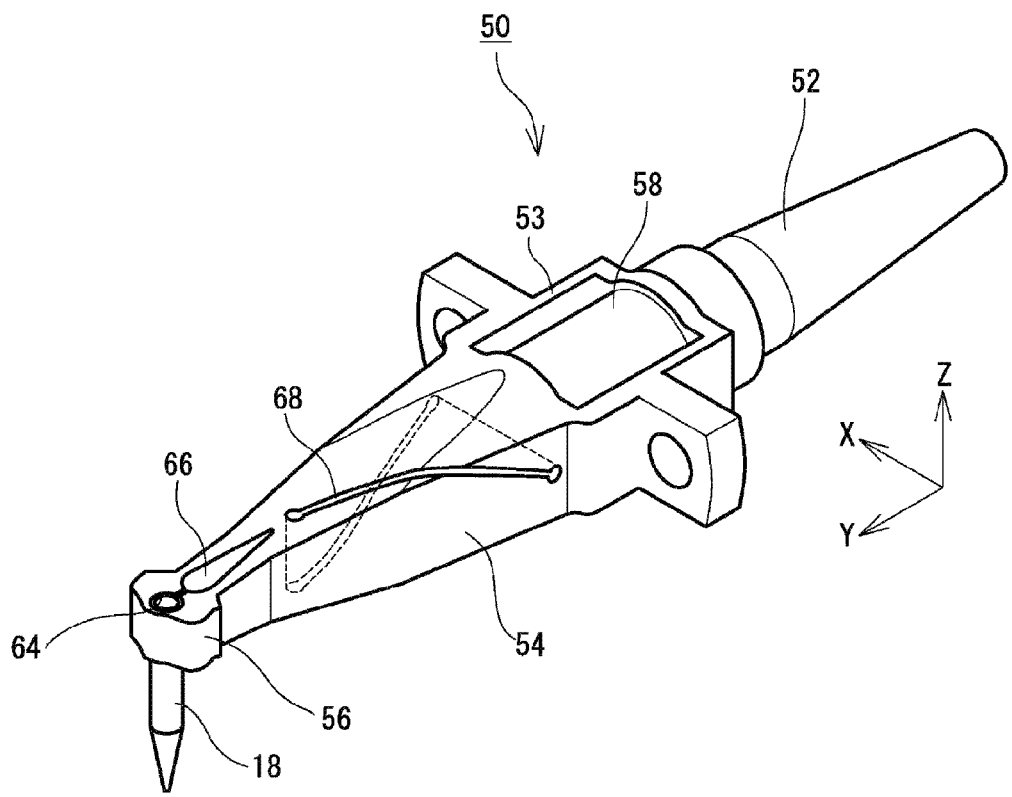
FIG. 2 is a perspective view of the ultrasonic horn.
Figure 3:
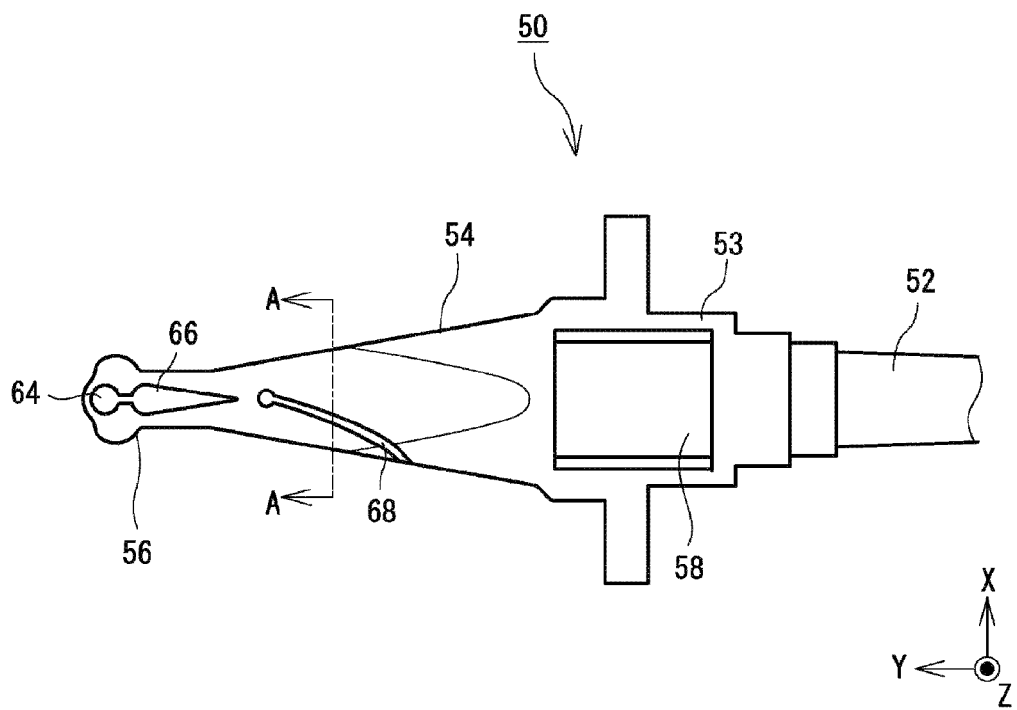
FIG. 3 is a plan view of the ultrasonic horn.
Figure 4:
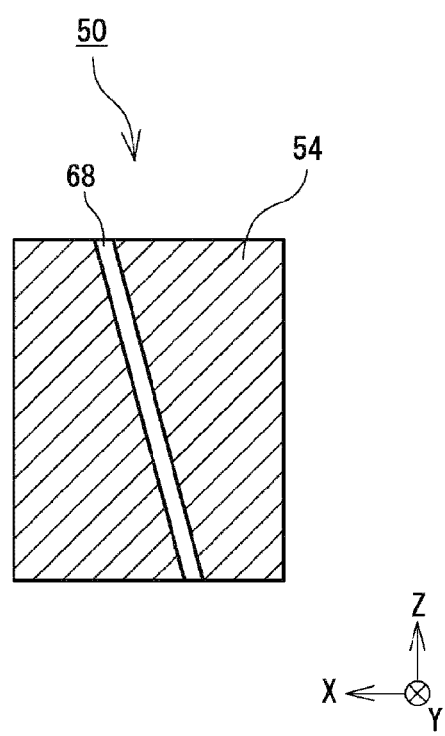
FIG. 4 is a cross-sectional view taken along the line A-A of FIG. 3.

Next, the configuration of the ultrasonic horn 50 mounted on the manufacturing apparatus 10 will be described. FIG. 2 is a perspective view of the ultrasonic horn 50, and FIG. 3 is a plan view of the ultrasonic horn 50. Further, FIG. 4 is a cross-sectional view taken along the line A-A of FIG. 3.

In the ultrasonic horn 50, a base end part 52, a vibration source part 53, an intermediate part 54, and a tip end part 56 are aligned in a straight line from the base end side to the distal end side. The base end part 52 is a part attached to the horn holder 14, and has a substantially conical shape with a diameter decreasing as it approaches the base end side.

The ultrasonic vibrator 58 is incorporated in the vibration source part 53. The ultrasonic vibrator 58 is a vibration generation source that receives a drive signal, which is a voltage signal, to generate longitudinal vibration. This ultrasonic vibrator 58 has, for example, lead zirconate titanate (commonly known as PZT) which vibrates in response to an AC voltage, and is a bolt-tightened Langevin type vibrator (commonly known as BLT or BL vibrator) in which PZT is applied with a tightening pressure with scissors and screws (bolts) in a metal block. In this example, the ultrasonic vibrator 58 is applied with an AC signal of a first frequency (hereinafter referred to as "first drive signal") and an AC signal of a second frequency larger than the first frequency (hereinafter referred to as "second drive signal") at the same time.

The intermediate part 54 propagates the vibration generated by the ultrasonic vibrator 58 to the tip end part 56. In this example, the intermediate part 54 has a substantially pyramidal shape with a cross-sectional area decreasing as it approaches the tip end. With such a configuration, the vibration generated in the vibration source part 53 is amplified and propagated to the tip end part 56. Further, the intermediate part 54 is formed with a spiral hole 68 that converts part of the longitudinal vibration into torsional vibration, which will be described later.

The tip end part 56 is a part that holds the capillary 18. A mounting hole 64, which penetrates in the Z direction (that is, in the axial direction of the capillary 18) and into which the capillary 18 is inserted, is formed in the vicinity of the distal end of the tip end part 56. The diameter of the mounting hole 64 is slightly smaller than the diameter of the capillary 18 under no load. On the base end side of the mounting hole 64, an adjusting hole 66 penetrating in the Z direction and having a substantially drop shape when viewed from the Z direction is formed. The adjusting hole 66 and the mounting hole 64 are connected via a narrow slit. Therefore, when a special jig or the like is press-fitted into the adjusting hole 66 to widen the adjusting hole 66, the diameter of the mounting hole 64 is also expanded. Then, by expanding the diameter of the mounting hole 64, the capillary 18 can be inserted into the mounting hole 64. When the jig is separated from the adjusting hole 66 with the capillary 18 inserted into the mounting hole 64, the diameter of the mounting hole 64 is reduced and the capillary 18 is firmly held.

Here, as described above, a spiral hole 68 is formed in the intermediate part 54. The spiral hole 68 will be described in detail. The spiral hole 68 is a hole for converting part of the longitudinal vibration output by the ultrasonic vibrator 58 into torsional vibration. The spiral hole 68 is a hole that penetrates the intermediate part 54 in the radial direction and advances in the circumferential direction as it advances in the axial direction. More specifically, the spiral hole 68 penetrates the intermediate part 54 in the X direction (that is, in the direction orthogonal to both the axial direction of the ultrasonic horn 50 and the axial direction of the capillary 18) so as to pass through both side surfaces of the intermediate part 54 in the base end side end portion thereof. The penetrating direction of the spiral hole 68 changes so as to approach the Z direction as it advances toward the tip end side in the axial direction. Then, the spiral hole 68 penetrates the intermediate part 54 in the Z direction so as to pass through the upper surface and the bottom surface of the intermediate part 54 in the tip end side end portion thereof. In other words, the penetrating direction of the spiral hole 68 is rotated by ¼ in the circumferential direction in the process of advancing from the base end side end portion to the tip end side end portion. From another point of view, the spiral hole 68 is shaped like a flat plate twisted 90 degrees.

Figure 5:
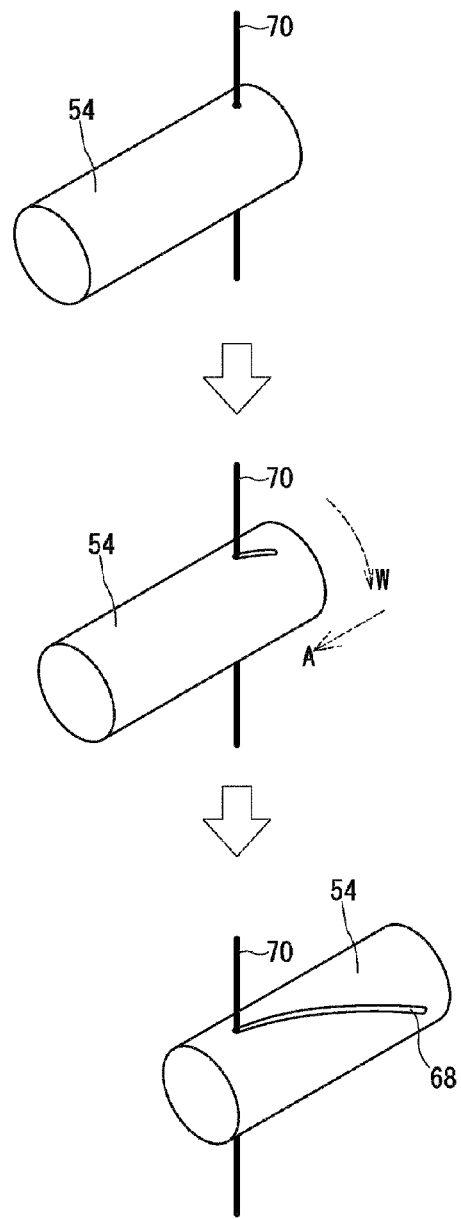
FIG. 5 is a schematic view showing the states of formation of the spiral hole.

Such a spiral hole 68 can be formed by, for example, wire electric discharge machining. FIG. 5 is a schematic view showing the states of forming and machining the spiral hole 68. In FIG. 5, the ultrasonic horn 50 is shown as a cylinder for the sake of simplicity. When forming the spiral hole 68, a discharge wire 70 is disposed through in the radial direction as shown in FIG. 5[A]. In that state, the ultrasonic horn 50 is relatively moved in the axial direction A and the circumferential direction W with respect to a discharge wire 70 while electric discharge machining is performed. Thus, a spiral through hole is formed in the ultrasonic horn 50. As a matter of course, the spiral hole 68 is not necessarily formed by wire electric discharge machining, and may be formed by other machining techniques such as laser machining.

Here, as is clear from the above description, the spiral hole 68 is a single hole and penetrates the intermediate part 54 in the radial direction. With such a configuration, longitudinal vibration can be efficiently converted into torsional vibration, and a variation in vibration characteristics for each individual can be suppressed. This will be described in comparison with a comparative example.

Figure 7:
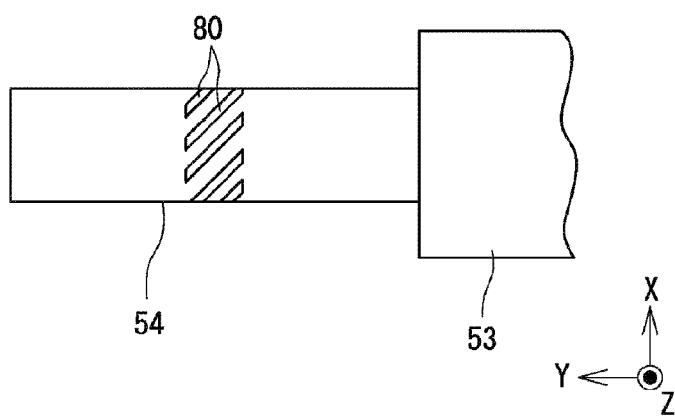
FIG. 7 is a view showing the ultrasonic horn of a comparative example.

FIG. 7 is a schematic view of an ultrasonic horn 50* of a comparative example. In the ultrasonic horn 50* of the comparative example, a plurality of inclined grooves 80 are formed instead of the spiral hole 68 in the intermediate part 54. The inclined groove 80 is a groove that advances in the circumferential direction as it advances in the axial direction, and converts longitudinal vibration into torsional vibration. However, unlike the spiral hole 68, the inclined groove 80 exists only on the surface layer of the peripheral surface of the intermediate part 54 and does not penetrate the intermediate part 54 in the radial direction. Therefore, the inclined groove 80 has a lower efficiency of conversion from longitudinal vibration into torsional vibration than the spiral hole 68. Therefore, in the comparative example, the efficiency of conversion into torsional vibration is enhanced by forming a plurality of inclined grooves 80. However, when a plurality of inclined grooves 80 are provided, an error in the mutual positions of the plurality of inclined grooves 80 and a variation in the shape occur, and the vibration characteristics are changed. As a result, in the configuration of the comparative example, individual differences in the vibration characteristics of the ultrasonic horn 50* are likely to occur.

Further, when the ultrasonic horn 50* of the comparative example is used, the first drive signal and the second drive signal are applied in parallel. When the vibration generated by the first drive signal is referred to as "first vibration" and the vibration generated by the second drive signal is referred to as "second vibration", in the comparative example, the inclined grooves 80 are formed at positions to be a node of the first vibration and an antinode of the second vibration. With such a configuration, the first vibration is propagated to the tip end part 56 as longitudinal vibration, and the second vibration is converted into torsional vibration by the inclined grooves 80 and propagated to the tip end part 56. In other words, in the case of the configuration of the comparative example, it is necessary to set the positions of the inclined grooves 80 in consideration of the antinode position and the node position of two vibrations having different frequencies, and the design tends to be complicated.

On the other hand, the ultrasonic horn 50 disclosed in the present specification has only one spiral hole 68 formed as described above. Since the spiral hole 68 penetrates the intermediate part 54 in the radial direction, the longitudinal vibration propagated from the vibration source part 53 can be efficiently converted into torsional vibration. In other words, according to the ultrasonic horn 50 of this example, longitudinal vibration can be reliably converted into torsional vibration without considering the antinode position and the node position of the first and second vibrations. As a result, the design of the position of the spiral hole 68 can be simplified. Furthermore, only one spiral hole 68 is formed in the ultrasonic horn 50. Therefore, an error in the mutual positions and a variation in the shape do not occur, and individual differences in vibration characteristics for each ultrasonic horn 50 can be reduced.

Next, the vibration obtained by the ultrasonic horn 50 of this example will be described. When executing ultrasonic processing, the controller 32 applies the first drive signal of the first frequency and the second drive signal of the second frequency to the ultrasonic vibrator 58 in parallel. In response to this, the vibration source part 53 generates longitudinal vibration of the first frequency, that is, first vibration, and longitudinal vibration of the second frequency, that is, second vibration. Both of the two types of longitudinal vibrations are partially converted into torsional vibrations as they pass through the spiral hole 68. The first vibration after conversion and the second vibration after conversion are vibrations in directions substantially orthogonal to each other. The first vibration after conversion and the second vibration after conversion are propagated to the tip end part 56 in parallel, so that the tip end part 56 vibrates in a substantially planar manner. As a result, the ultrasonic processing can be performed more efficiently.

Figure 6A:
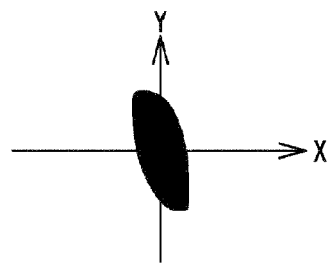
FIG. 6A is a diagram showing a movement locus of the tip end part when the first drive signal is applied.
Figure 6B:
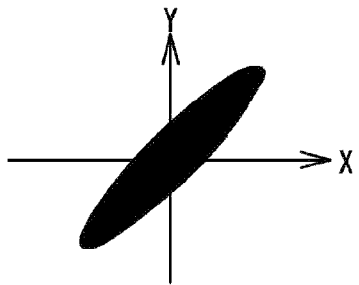
FIG. 6B is a diagram showing a movement locus of the tip end part when the second drive signal is applied.
Figure 6C:
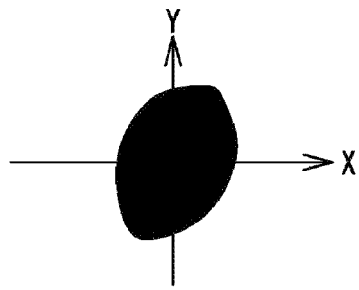
FIG. 6C is a diagram showing a movement locus when the first drive signal and the second drive signal are applied.

This will be described with reference to FIG. 6. FIG. 6A to FIG. 6C are diagrams showing the movement of vibration of the tip end part 56. More specifically, FIG. 6A shows the movement locus of the tip end part 56 when only the first drive signal is applied. Similarly, FIG. 6B shows the movement locus of the tip end part 56 when only the second drive signal is applied, and FIG. 6C shows the movement locus of the tip end part 56 when the first drive signal and the second drive signal are applied in parallel. In FIG. 6A to FIG. 6C, the portion that appears to be painted black is a portion where a large number of lines indicating the movement locus of the tip end part 56 overlap. As shown in FIG. 6A, when only the first drive signal is applied, the movement of the tip end part 56 is a movement in which longitudinal vibration and torsional vibration are mixed as a whole, although the longitudinal vibration component is large. As a result, the tip end part 56 vibrates to move between the second quadrant and the fourth quadrant.

On the other hand, when only the second drive signal is applied, as shown in FIG. 6B, the movement of the tip end part 56 is a movement in which longitudinal vibration and torsional vibration are mixed, and the tip end part 56 vibrates to move between the first quadrant and the third quadrant. When the first drive signal and the second drive signal are applied in parallel, the movement of the tip end part 56 is a movement as if the movement shown in FIG. 6A and the movement shown in FIG. 6B are combined. As a result, the tip end part 56 vibrates in a substantially planar manner, as shown in FIG. 6C. Then, the tip end part 56 and, by extension, the capillary 18 vibrate in a planar manner, so that the ultrasonic processing can be performed more efficiently.

As is clear from the above description, according to the ultrasonic horn 50 of this example, longitudinal vibration can be efficiently converted into torsional vibration while individual differences in vibration characteristics are suppressed to a low level. Nevertheless, the configuration described so far is an example, and other configurations may be modified as appropriate provided that a single spiral hole 68 that penetrates in the radial direction and advances in the axial direction as it advances in the circumferential direction is formed in the intermediate part 54 of the ultrasonic horn 50. For example, in the above description, the spiral hole 68 has a shape that advances by ¼ turn in the circumferential direction from the base end side end portion to the tip end side end portion. However, the circumferential range of the spiral hole 68 may be smaller than ¼ turn or larger than ¼ turn as long as sufficient strength and vibration characteristics can be obtained. For example, the spiral hole 68 may have a shape that advances by ½ turn in the circumferential direction from the base end side end portion to the tip end side end portion.

Further, in the above description, the spiral hole 68 penetrates in the tip end side end portion in the X direction, that is, in the direction orthogonal to both the axial direction of the capillary 18 and the axial direction of the ultrasonic horn 50. With such a configuration, the penetrating direction of the tip end side end portion of the spiral hole 68 and the penetrating direction of the mounting hole 64 of the capillary 18 are substantially parallel. With such a configuration, torsional vibration is more likely to be propagated to the tip end part 56 as compared with a case where the holes 68 and 64 are non-parallel. However, such a penetrating direction may be changed as appropriate. Therefore, for example, the spiral hole 68 may be arranged such that the tip end side end portion thereof penetrates in the Z direction and the base end side end portion thereof penetrates in the X direction.

Further, in the description so far, the intermediate part 54 of the ultrasonic horn 50 has a tapered shape with a cross-sectional area decreasing from the base end side toward the tip end side. With such a configuration, the vibration is amplified as it approaches the tip end side. However, depending on the characteristics required for the ultrasonic horn 50, the intermediate part 54 may have other shapes such as a round bar having a constant diameter.

Furthermore, in the description so far, the semiconductor device manufacturing apparatus 10 equipped with the ultrasonic horn 50 has been described as an example, but the ultrasonic horn 50 disclosed in the present specification may be incorporated into other types of ultrasonic processing apparatuses such as an ultrasonic welding apparatus.

What is claimed is:

1. An ultrasonic horn, comprising:
   a vibration source part to which an ultrasonic vibrator is mounted;
   a tip end part to which a machining tool is mounted; and
   an intermediate part which is interposed between the tip end part and the vibration source part and propagates vibration generated by the ultrasonic vibrator to the tip end part,
   wherein the intermediate part has a single spiral hole which is a hole penetrating in a radial direction of the ultrasonic horn and advances in an axial direction as the spiral hole advances in a circumferential direction,
   wherein the tip end part has a mounting hole which penetrates in a first direction orthogonal to the axial direction and to which the machining tool is mounted, and
   a tip end side end portion of the spiral hole penetrates in a direction substantially parallel to the first direction.

2. An ultrasonic horn, comprising:
   a vibration source part to which an ultrasonic vibrator is mounted;
   a tip end part to which a machining tool is mounted; and
   an intermediate part which is interposed between the tip end part and the vibration source part and propagates vibration generated by the ultrasonic vibrator to the tip end part,
   wherein the intermediate part has a single spiral hole which is a hole penetrating in a radial direction of the ultrasonic horn and advances in an axial direction as the spiral hole advances in a circumferential direction,
   wherein the spiral hole has a shape that advances by ¼ turn in the circumferential direction between a base end side end portion and the tip end side end portion.

3. The ultrasonic horn according to claim 1, wherein the intermediate part has a tapered shape with a cross-sectional area that decreases from a base end side toward a tip end side.

4. A manufacturing apparatus of a semiconductor device, comprising:
   the ultrasonic horn according to claim 1; and
   a cylindrical capillary which is mounted to the tip end part of the ultrasonic horn and through which a wire is inserted.

5. The ultrasonic horn according to claim 2, wherein the intermediate part has a tapered shape with a cross-sectional area that decreases from a base end side toward a tip end side.

* * * * *